United States Patent [19]

Akiyama et al.

[11] Patent Number: 5,638,335

[45] Date of Patent: Jun. 10, 1997

[54] SEMICONDUCTOR DEVICE

[75] Inventors: Noboru Akiyama, Hitachinaka; Seigoh Yukutake, Kodaira; Sadayuki Ohkuma, Oume; Akihiko Emori, Hitachi; Takashi Akioka, Akishima; Shuichi Miyaoka, Hannou; Shinji Nakazato, Maebashi; Kinya Mitsumoto, Tamamura, all of Japan

[73] Assignee: Hitachi, Ltd., Tokyo, Japan

[21] Appl. No.: 649,166

[22] Filed: May 17, 1996

[30] Foreign Application Priority Data

May 22, 1995 [JP] Japan ................................. 7-122119

[51] Int. Cl.$^6$ ................................................. G06F 13/00
[52] U.S. Cl. ........................... 365/230.03; 365/63; 365/52
[58] Field of Search ............................. 365/230.03, 63, 365/52, 193, 230.01

[56] References Cited

U.S. PATENT DOCUMENTS 5,228,132  7/1993  Neal et al. ................... 365/230.03
5,243,570  9/1993  Saruwatari ......................... 365/63
5,289,428  2/1994  Sato ............................. 365/230.03

Primary Examiner—David C. Nelms
Assistant Examiner—Vu A. Le
Attorney, Agent, or Firm—Antonelli, Terry, Stout & Kraus, LLP

[57] ABSTRACT

A memory device comprising a memory array having a plurality of bits, including parity bits, and comprising a plurality of memory blocks, and a bit structure changing section for changing the input/output bits of the memory array, wherein the number of the memory blocks are prescribed to be an integral multiple of three and the input/output bits of the plurality of memory blocks are even. Thereby, the bit structure of the semiconductor memory, having parity bits and which is capable of changing the input/output bits to a plurality of bit structures, can be changed while maintaining the bit structure of the memory blocks even and without increase in propagation delay time.

6 Claims, 5 Drawing Sheets

| NUMBER OF MEMORY ARRAY DIVISIONS (NUMBER OF BLOCKS) \ BIT STRUCTURE | NUMBER OF BITS PER BLOCK | | |
|---|---|---|---|
| | X72 | X36 | X18 |
| 3 | 24 | 12 | 6 |
| 6 | 12 | 6 | 3 |
| 9 | 8 | 4 | 2 |

SEMICONDUCTOR DEVICE

BACKGROUND OF THE INVENTION

This invention relates to a semiconductor integrated circuit device, and more particularly relates to a high-speed semiconductor memory having parity bits, or to a semiconductor device including such a memory.

With the progress of large capacity memories, a memory structure, in which a memory cell array is divided into a plurality of blocks and a block is further divided into a plurality of mats, has been employed to reduce the number of circuits operated simultaneously, with a view toward reduction of power consumption.

For example, when data consisting of a plurality of bits is inputted or outputted to a single address, a certain single memory block is selected from a plurality of memory blocks and a certain plurality of memory cells is selected in a single memory mat in the memory block, and the data of a plurality of bits are outputted or inputted simultaneously.

In a high-speed semiconductor memory, all memory blocks are selected, and in each memory block, a memory cell in each single memory mat is selected, thus the data of a plurality of bits are outputted or inputted simultaneously.

In both cases, in a single semiconductor memory chip, the memory is divided into memory blocks of the n-th power of 2 (n is an integer).

In such a semiconductor memory, which is divided into memory blocks of the n-th power of 2, when the semiconductor memory has parity bits and it is required to change the number of input/output bits to different bit structures, the semiconductor memory is disadvantageous for reasons described hereinunder.

For example, it is assumed that a chip can have either a x36 bit structure or a x18 bit structure. In this case, if the smaller bit structure (x18) is realized, the input/output data bits are not distributed evenly to the plurality of memory blocks, so that a signal propagation path is required between the plurality of memory blocks. The signal propagation path hinders high speed processing, which is a disadvantage of this method.

For example, in a semiconductor memory having four memory blocks (the square of 2), the input/output bits of each block consist of nine bits when selecting the x36 bit structure. On the other hand, the distribution generates two types of input/output bits for the blocks, namely four bit memory blocks and five bit memory blocks when selecting the x18 bit structure.

Each block is structured so as to generate nine bits; therefore, when switching from x36 bits to x18 bits, a logic arrangement for outputting a one bit signal for each two adjacent bits (or inputting the signal to either bit) is necessary. Also, a logic arrangement is required so that the ninth bit is paired with one bit of another memory block and a signal of either bit is outputted (or the signal is inputted to either bit).

Therefore, bit signals other than the residual ninth bit are transferred using a path in the corresponding memory blocks; however, the signal line of the residual ninth bit is required to be connected to the adjacent memory block, and the connection results in a problem of increased propagation delay time on a signal bass line.

SUMMARY OF THE INVENTION

It is an object of the present invention to provide a semiconductor memory having parity bits and which is capable of changing the input/output bits to a plurality of input/output bits, in which the semiconductor memory has even bits constituent of a memory block and operates at high speed without increased propagation delay time even when the bit structure is changed, or to a semiconductor device such as a microcomputer using the memory.

According to one aspect of the present invention, there is provided a semiconductor memory comprising: a memory array including a plurality of bits including parity bits, and of a structure divided into a plurality of memory blocks; and a bit structure changing section for changing input/output bits of the above-mentioned memory array, in which the number of memory blocks is an integral multiple of 3, and the plurality of memory blocks have even input/output bits individually.

As described hereinabove, by providing the number of memory block of an integral multiple of 3, the number of bits per memory block can be even when the bit structure is changed, therefore, a bass line among memory blocks is not required. In other words, a high-speed semiconductor memory having parity bits and variable bit structures can be realized without increased propagation delay time on a signal bass line.

DESCRIPTION OF THE PREFERRED EMBODIMENTS

Figure 1:
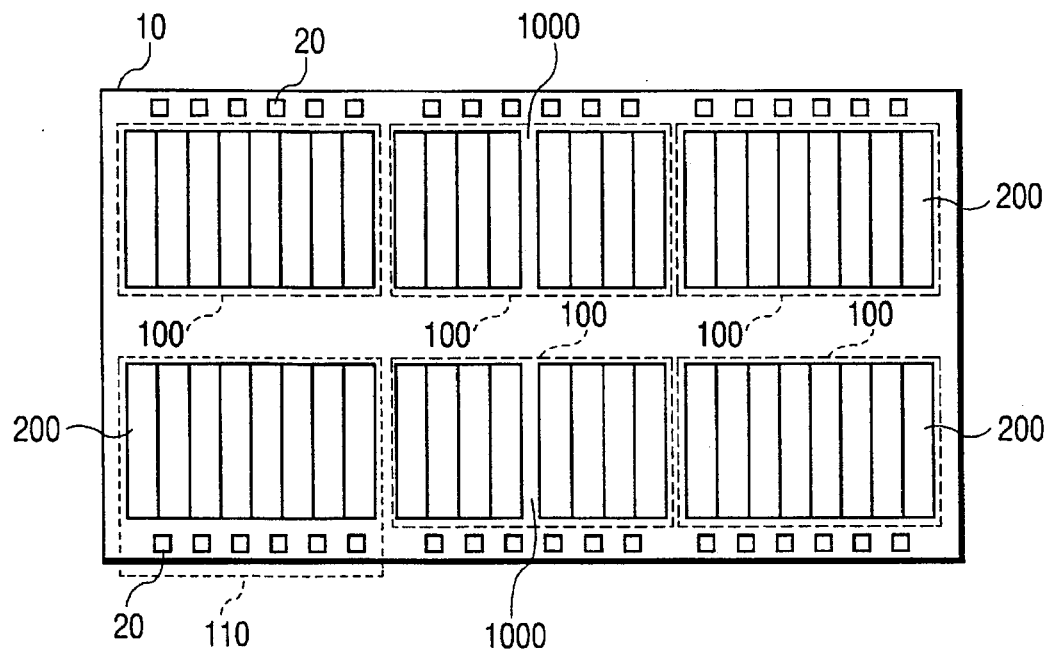
FIG. 1 is a diagram for illustrating an example of a memory array structure of the present invention.
Figure 2:
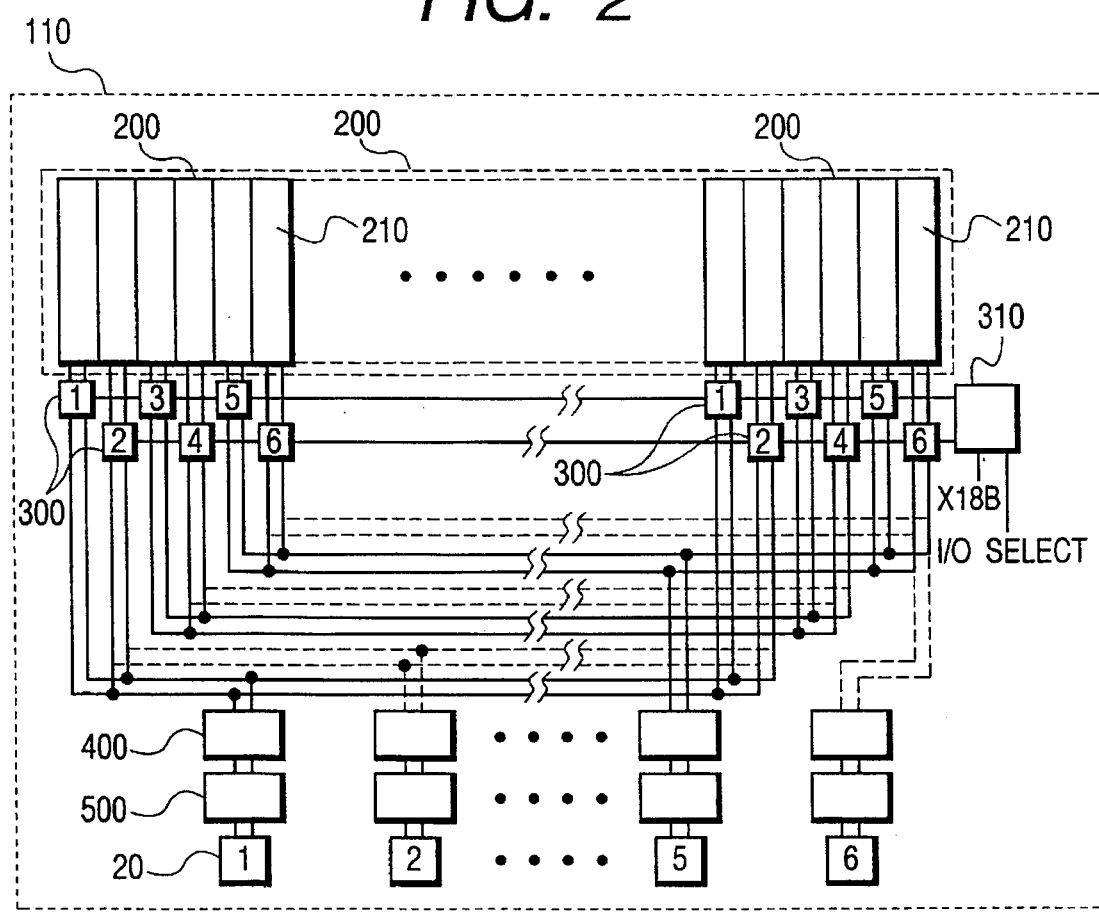
FIG. 2 is a diagram for illustrating an example of a memory block structure of the present invention.

FIG. 1 and FIG. 2 show an embodiment of the present invention. In a semiconductor memory chip 10, a memory array is divided into six memory blocks 100. Each memory block 100 is further divided into eight memory mats 200, and each memory mat 200 is divided into six memory units 210. Reference numeral 20 represents a pad for data input/output.

Each of the two memory blocks 100 located at the center of the chip is provided with a peripheral circuit 1000 at the center thereof. In such a memory block, two sets of four memory mats are located on the right and left sides respectively with the interposition of the peripheral circuit 1000, there between, although these memory blocks are operated in the same manner as the other memory blocks. Thereby, the peripheral circuits 1000 are located at the center of the chip in good balance, and the signal propagation delay of the bass line is prevented.

In this embodiment, a semiconductor memory having a variable bit structure of x36 bits and x18 bits (including parity bits of x4 bits and x2 bits) will be described.

A semiconductor memory or semiconductor device according to the present invention has an I/O selector 310 for selecting one bit structure from a plurality of bit structures. To the I/O selector 310, there are inputted a signal x18B for selecting either one of the x18 bit structure and the x36 bit structure and a signal I/O select for selecting either one of x18 bits from two sets of x18 bits (x18a and x18b) when x18 bits are selected.

A data selector 300 receives an output signal from the I/O selector 310, and switches the data input/output.

Numeral 400 represents a sense circuit or write buffer circuit, and numeral 500 represents an output buffer or data input buffer (Din buffer). Eighteen input/output pads 20 are provided on the top and bottom of the chip individually, so that a total of 36 pads are provided. When the x36 bit structure is selected, all 36 pads are used, but when the x18 bit structure is selected, only half, namely 18 pads, is used.

In FIG. 2, the area 110 in FIG. 1 is illustrated in enlarged view. Six input/output pads 20 are provided for the area 110, and when the x18 bit structure is selected, only the three pads No. 1, No. 3 and No. 5 are used. In this figure, the bass line between the data selectors 300 and the pads 20 is represented by solid lines for the selection of the x18 bit structure. In detail, the data selectors of the No. 1, No. 3 and No. 5 pads are connected in common, and on the other hand, the data selectors of the No. 2, No. 4 and No. 6 pads are connected in common. Depending on the I/O select signal, the data selector group of No. 1, No. 3 and No. 5 selectors 300 or the data selector group of No. 2, No. 4 and No. 6 selectors 300 is operated, selectively.

When the x36 bit structure is selected, the signal bass lines connected to the data selectors 300 No. 1, No. 3 and No. 5, and No. 2, No. 4 and No. 6 are separated from each other, and the signal bass lines connected to the data selectors 300 No. 2, No. 4 and No. 6 are connected as shown with rough dotted lines.

Memory blocks formed on areas other than the area 110 are structured in the same manner as the memory blocks in the area 110. Signal bass lines connecting the memory units 210 and the input pads 20 are closed in each memory block, and the signal bass lines are not formed connecting to a plurality of memory blocks.

Figure 7:
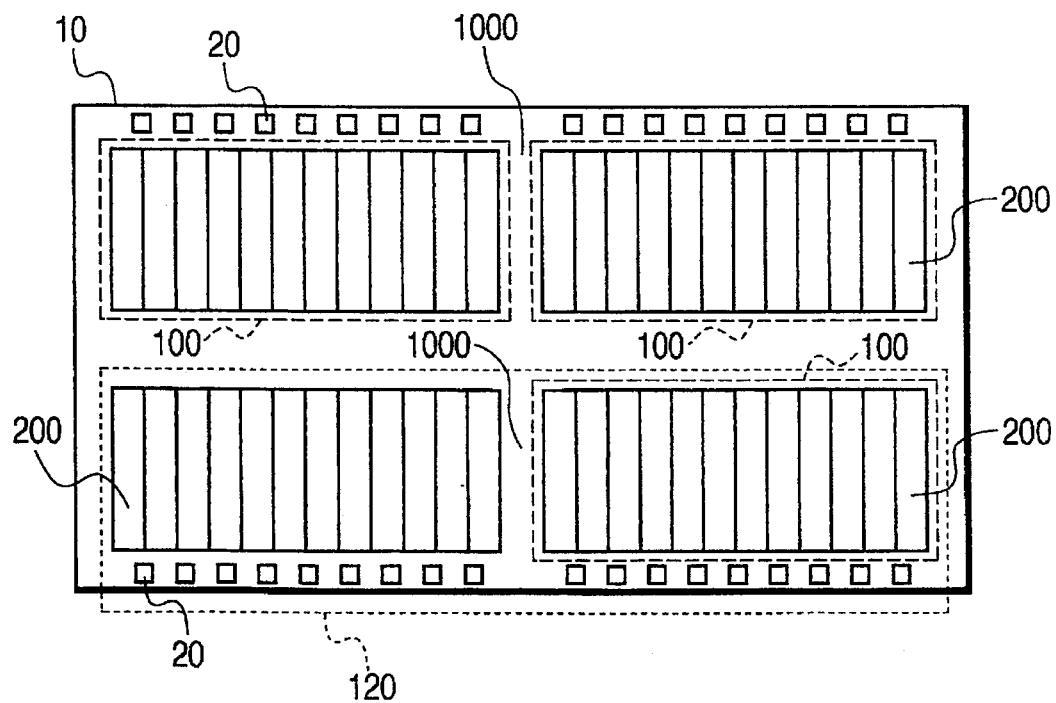
FIG. 7 is a diagram for illustrating an example of a memory array structure of a prior art.
Figure 8:
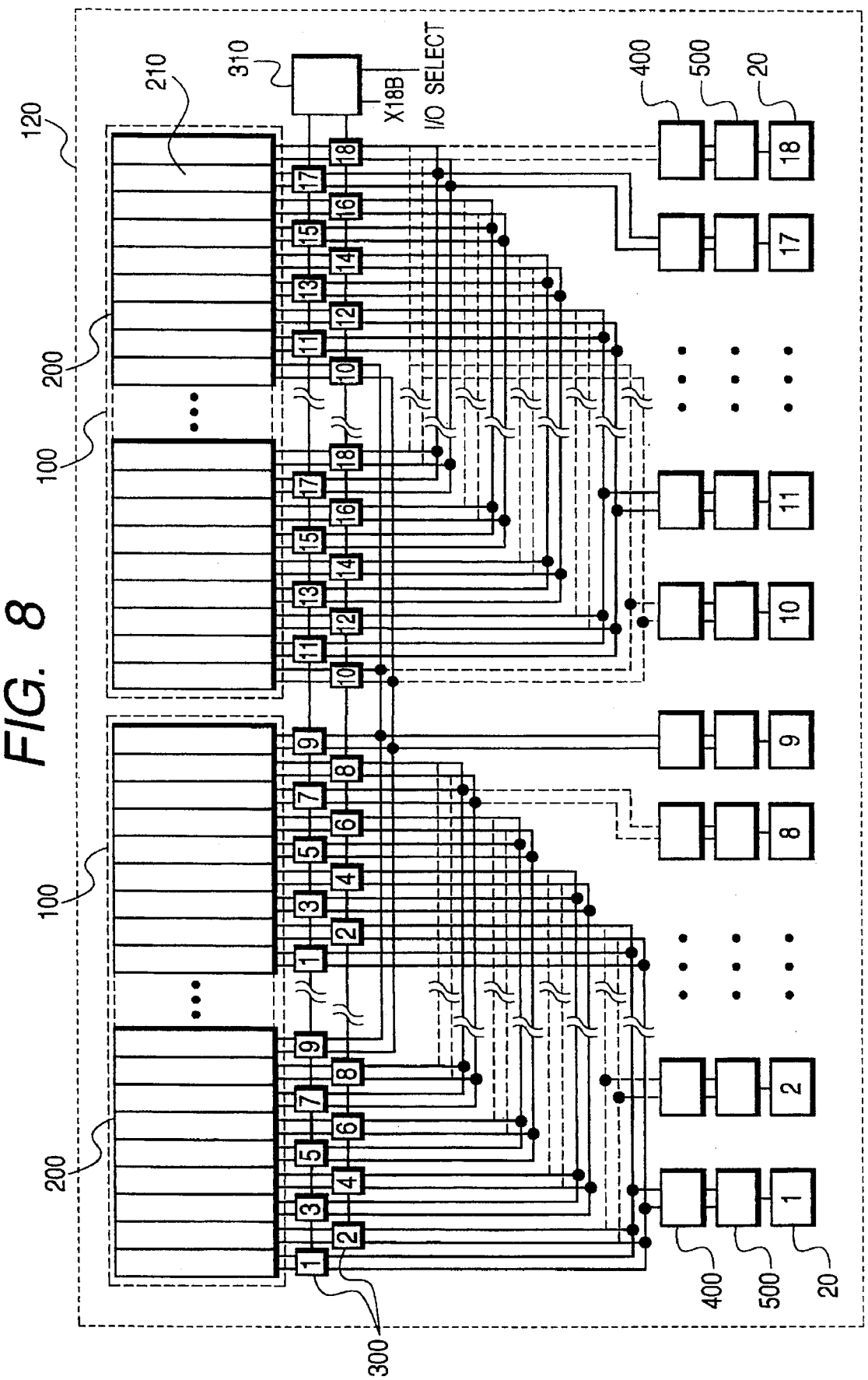
FIG. 8 is a diagram for illustrating an example of a memory block structure of the prior art.

On the other hand, in the case of a conventional memory having memory blocks of n-th power of 2 as shown in FIG. 7 and FIG. 8 (herein n=2), for x18 bit structure, for example, the number of input/output bits is five bits for the left side memory block of the chip and four bits for the right side memory block of the chip, that is, the number of input/output bits is unbalanced. Signal bass lines connecting data selectors 300 No. 1 to No. 8 or data selectors 300 No. 11 to 18 are closed in individual memory blocks. However, signal bass lines connecting data selectors 300 No. 9 and No. 10 extend over the right and left two memory blocks from the left end to the right end of the chip, therefore, the signal propagation delay time is increased because of the long path.

Figure 3:
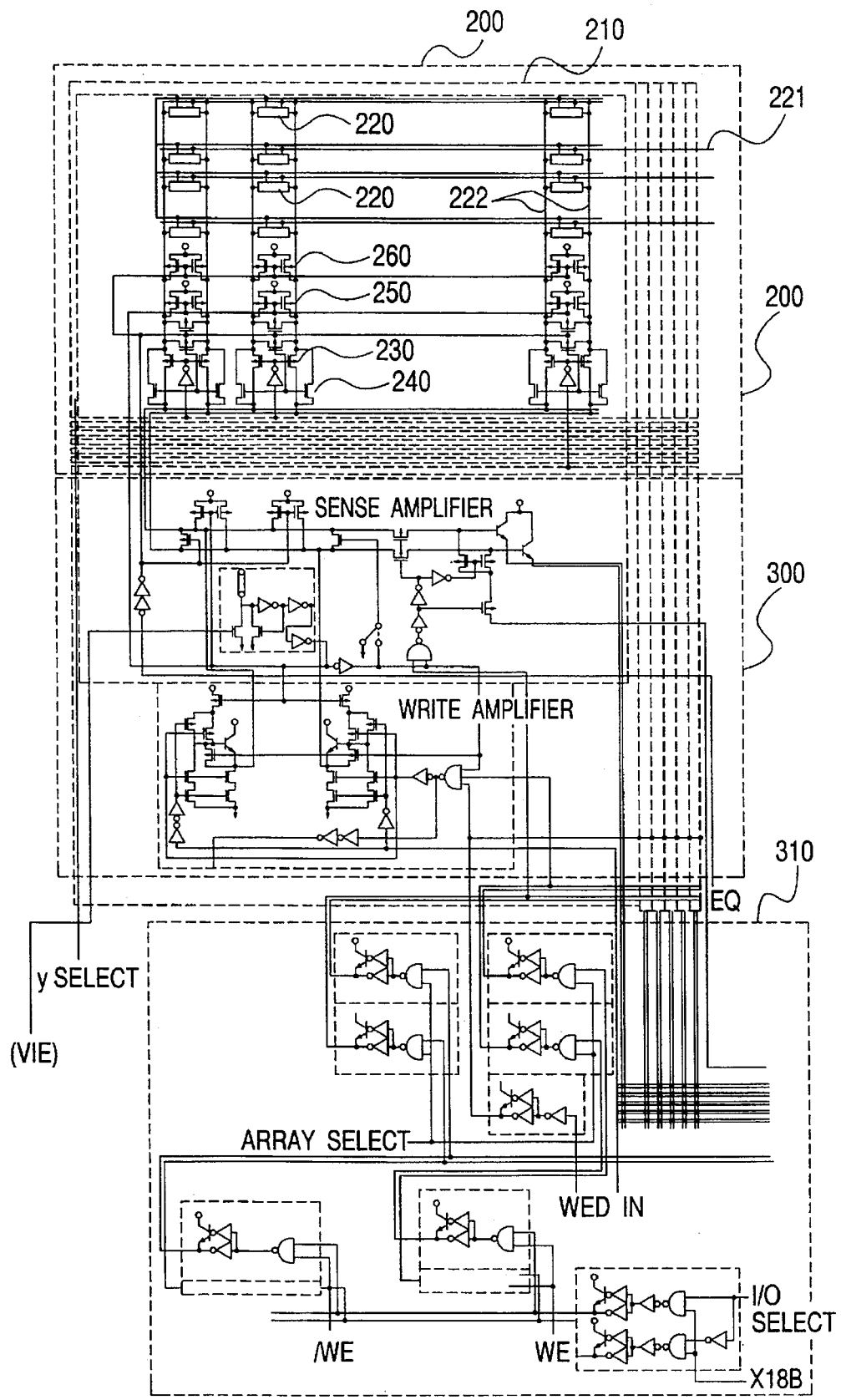
FIG. 3 is a diagram for illustrating an example of a memory structure of the present invention.

In FIG. 3, an embodiment of the memory unit 210, the data selector 300, and the I/O selector 310 is shown. For reading of data, a data signal of a memory cell 220 connected to a selected word line 221 appears on a bit line 222, and is fed to the sense amplifier through a reading column select switch 240, then is transmitted to the next step sense circuit. On the other hand, for writing of data, an output signal of a write amplifier circuit is fed to the bit line 222 through a writing column select switch 230, and is written to the memory cell 220.

When the x36 bit structure is selected, the x18B signal is L-level. At this time, the output of the I/O selector 310 H-level regardless of the I/O select signal for all data selectors 300 in each memory unit 210, therefore, all six data selectors 300 are operated.

On the other hand, when the x18 bit structure is selected, the x18B signal H-level, and depending on the potential level of I/O select signal, the data selectors 300 of odd number or even number are operated.

In the embodiment, operations of the write amplifier circuit and the sense amplifier circuit are controlled by the output signal of the I/O selector 310, otherwise, the bit structure is changed similarly by controlling the operation of the column select switch using the above-mentioned output signal.

Figures 4, 5:
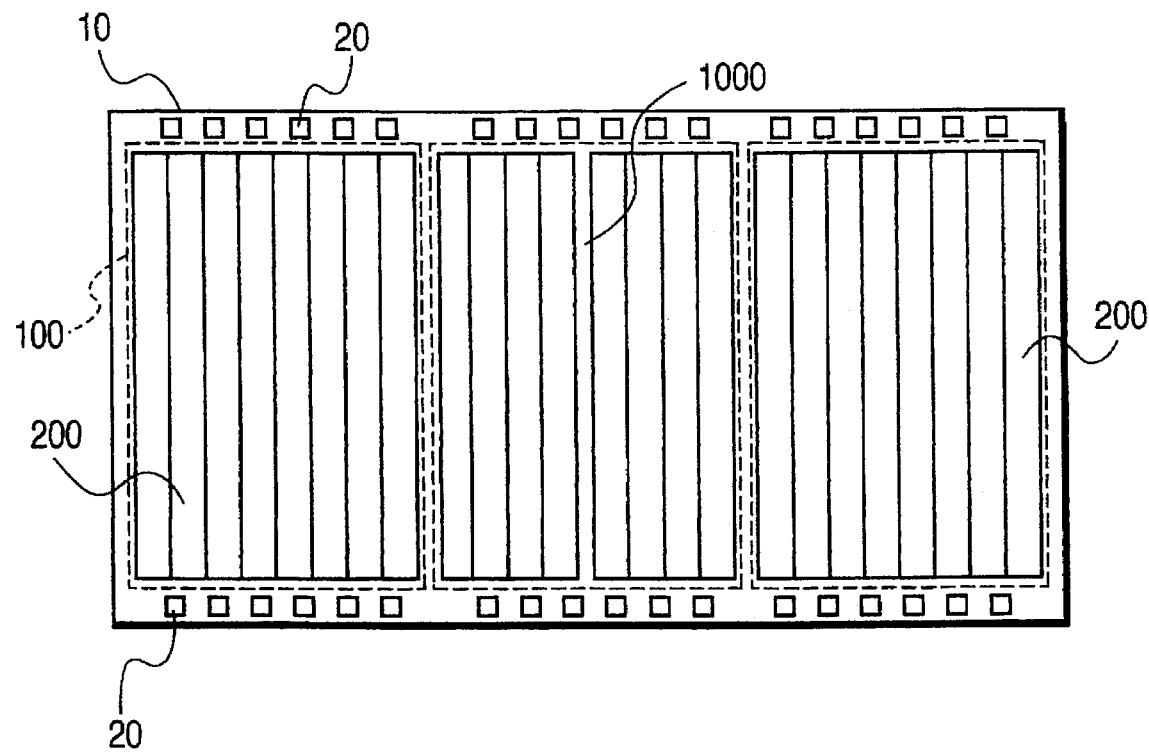
FIG. 4 is a table for describing the number of bits per memory block.
FIG. 5 is a diagram for illustrating an example of a chip structure of another embodiment of the present invention.
Figure 6:
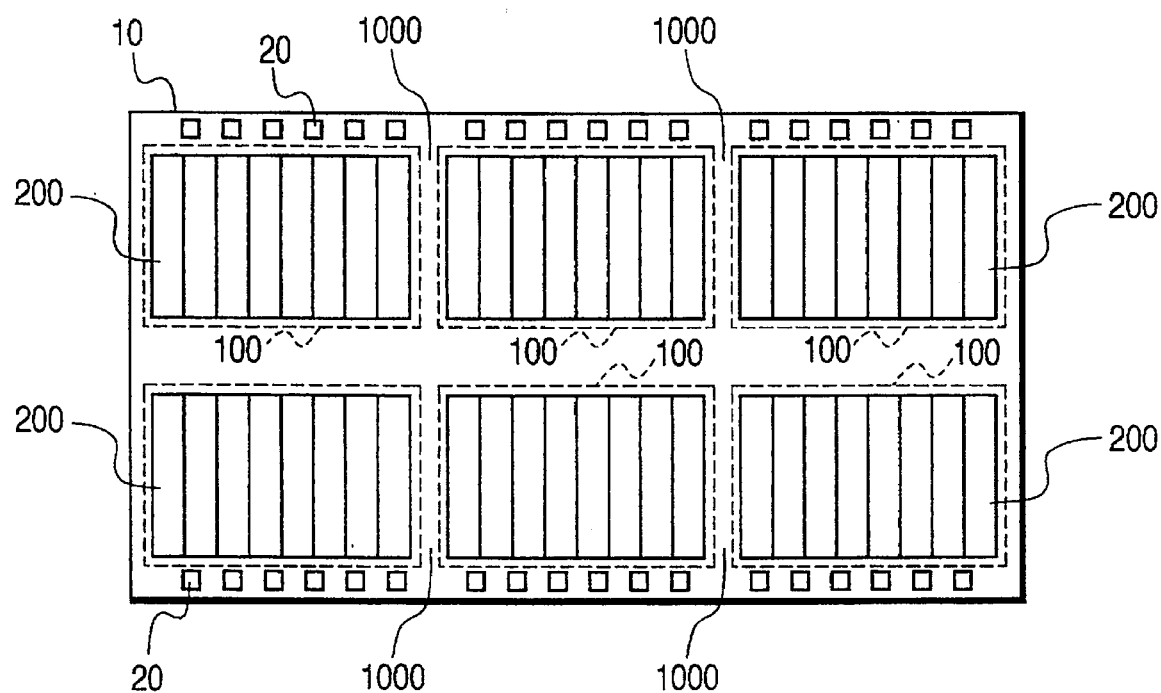
FIG. 6 is a diagram for illustrating an example of a chip structure of still another embodiment of the present invention.

In FIG. 5, a second embodiment of a chip structure having three memory blocks is shown. In FIG. 6, a third embodiment of a chip structure having six memory blocks and provided with peripheral circuits 1000 between the memory blocks is shown.

The effect of the present invention will be described with reference to a semiconductor memory which has x72 bit structure, x36 bit structure and x18 bit structure having parity bits appended to a usual x64 bit structure, x32 bit structure and 16 bit structure, on a single chip using master slice or bonding options.

In FIG. 4, the numbers of bits per one memory block when the memory blocks are divided into an integral multiple of 3 are listed. When the number of memory blocks is three, the input/output bits of each memory block are 24, 12 and 6 bits for a x72 bit structure, a x36 bit structure and a x18 bit structure, otherwise, when the number of memory blocks is six or nine, the bit is distributed evenly to 12, 6 and 3 bits or 8, 4 and 2 bits, respectively.

As described hereinbefore, by designing the number of memory blocks to be an integral multiple of 3, the number of bits can be divided evenly for each memory block regardless of the bit structure, and signal bass lines connected to a plurality of memory blocks are not required. In other words, the signal transmission paths connected to a plurality of memory blocks are eliminated, thereby, a high-speed semiconductor memory having parity bits and a variable bit structure is realized without increased bass line propagation delay.

What is claimed is:

1. A semiconductor memory comprising:
   a memory array having a plurality of bits including parity bits, and comprising a plurality of memory blocks; and
   a bit structure changing section for changing the input/output bits of said memory array,
   wherein the number of said memory blocks is an integral multiple of three and the number of input/output bits of said plurality of memory blocks is even.

2. A semiconductor memory as claimed in claim 1, wherein a peripheral circuit is provided at the center of a central memory block, which is located at the center of a chip and forms one of said plurality of memory blocks.

3. A semiconductor memory comprising:
   a memory array having a plurality of bits including parity bits, and comprising a plurality of memory blocks, and
   a bit structure changing section for changing the input/output bits of said memory array,
   said bit structure changing section being provided with:
   (a) an I/O selector for selecting one bit structure from a plurality of bit structures, and
   (b) a data selector responsive to an output signal from said I/O selector for changing the data input bits or the data output bits, wherein the number of said memory blocks is an integral multiple of three and the number of input/output bits of said plurality of memory blocks is even.

4. A semiconductor memory as claimed in claim 3, wherein said data selector has at least a write amplifier for writing data to a memory cell and a sense amplifier for amplifying data outputted from a memory cell.

5. A semiconductor memory as claimed in claim 4, wherein said data selector has at least a column select switch for connecting or disconnecting bit lines connected to memory cells with or from said write amplifier and sense amplifier.

6. A semiconductor memory as claimed in claim 3, wherein a peripheral circuit is provided at the center of a central memory block which is located at the center of a chip and forms one of said plurality of memory blocks.

* * * * *